(12) United States Patent
Lygeros et al.

(10) Patent No.: US 9,606,963 B2
(45) Date of Patent: Mar. 28, 2017

(54) EVALUATING AND OPTIMIZING A TRAJECTORY FUNCTION

(71) Applicants: INTERNATIONAL BUSINESS MACHINES CORPORATION, Armonk, NY (US); ETH Zurich, Zurich (CH)

(72) Inventors: John Lygeros, Zurich (CH); Angeliki Pantazi, Rueschlikon (CH); Abu Sebastian, Rueschlikon (CH); Tomas Tuma, Rueschlikon (CH)

(73) Assignees: International Business Machines Corporation, Armonk, NY (US); Eth Zurich, Zurich (CH)

( * ) Notice: Subject to any disclaimer, the term of this patent is extended or adjusted under 35 U.S.C. 154(b) by 807 days.

(21) Appl. No.: 13/755,205

(22) Filed: Jan. 31, 2013

(65) Prior Publication Data

US 2013/0197882 A1    Aug. 1, 2013

(30) Foreign Application Priority Data

Jan. 31, 2012    (GB) .................................... 1201593.9

(51) Int. Cl.
*G06F 7/60* (2006.01)
*G06F 17/10* (2006.01)
*G06F 17/50* (2006.01)

(52) U.S. Cl.
CPC .............. *G06F 17/10* (2013.01); *G06F 17/50* (2013.01)

(58) Field of Classification Search
CPC ...................................................... G06F 17/11
USPC ......................................................... 703/2
See application file for complete search history.

(56) References Cited

U.S. PATENT DOCUMENTS

| | | | | |
|---|---|---|---|---|
| 4,675,501 A * | 6/1987 | Klingel | ................. | B23K 26/04 |
| | | | | 219/121.67 |
| 5,808,887 A * | 9/1998 | Dorst | .................... | B25J 9/1666 |
| | | | | 345/474 |
| 6,495,791 B2 * | 12/2002 | Hunter | .................. | B23K 26/04 |
| | | | | 219/121.6 |

(Continued)

FOREIGN PATENT DOCUMENTS

| | | | |
|---|---|---|---|
| JP | 61103206 A | 5/1986 | |
| WO | WO0188639 A2 | 11/2001 | |

OTHER PUBLICATIONS

T. Knopp et al., "Weighted iterative reconstruction for magnetic particle imaging", 2010, Physics in medicine and biology 55, pp. 1577-1589, 2427.*

(Continued)

*Primary Examiner* — Kamini S Shah
*Assistant Examiner* — Juan Ochoa
(74) *Attorney, Agent, or Firm* — Tutunjian & Bitetto, P.C.; Jennifer R. Davis

(57) ABSTRACT

A method for evaluating a trajectory function to be followed by a physical system includes providing the trajectory function; determining a set of sampling points by sampling a trajectory based on the trajectory function in the time domain; associating a cell to each of the sampling points; assessing at least one cell metric for each of the cells; aggregating the at least one cell metric of the cells to obtain an aggregated metric measure; and evaluating the trajectory as determined by the provided trajectory function depending on the one or more aggregated metric measures.

11 Claims, 5 Drawing Sheets

(56) References Cited

U.S. PATENT DOCUMENTS

| | | | | |
|---|---|---|---|---|
| 6,662,063 | B2* | 12/2003 | Hunter | B23K 26/04 |
| | | | | 257/E21.596 |
| 8,303,478 | B2* | 11/2012 | Lebosse | A61B 6/4441 |
| | | | | 600/13 |
| 8,379,204 | B1* | 2/2013 | Cordingley | G01B 11/00 |
| | | | | 356/399 |
| 9,129,236 | B2* | 9/2015 | Elinas | G06Q 10/06 |
| 2002/0146172 | A1 | 10/2002 | Nair et al. | |
| 2007/0124107 | A1* | 5/2007 | Numata | G06T 7/0065 |
| | | | | 702/168 |
| 2011/0190922 | A1* | 8/2011 | Walker | B24B 13/06 |
| | | | | 700/118 |

OTHER PUBLICATIONS

Weizenecker et al., "A simulation study on the resolution and sensitivity of magnetic particle imaging", 2007, Physics in Medicine and biology 52, pp. 6363-6374.*

Knopp et al., "A note on the iterative MRI reconstruction from nonuniform k-space data", 2007, International journal of biomedical imaging vol. 2007, pp. 1-9.*

Beni et al., Voronoi diagram: An adaptive spatial tessellation for processes simulation, 2010, INTECH Open Access Publisher, pp. 41-52.*

Knopp et al., "Trajectory analysis for magnetic particle imaging", 2009, Physics in medicine and biology 54.2, pp. 385-397.*

Tobias Knopp and Thorsten M. Buzug, "Magnetic Particle Imaging, an Introduction to Imaging Principles and Scanner Instrumentation", 2012, Springer Science & Business Media, pp. 1-204.*

Gleich et al., "Tomographic imaging using the nonlinear response of magnetic particles", 2005, Nature 435.7046: pp. 1214-1217.*

Fleming et al., "Optimal periodic trajectories for band-limited systems", 2009, Control Systems Technology, IEEE Transactions on17.3: pp. 552-562.*

Tuma et al., "Optimal scan trajectories for high-speed scanning probe microscopy", 2012, IEEE American Control Conference (ACC), pp. 3791-3796.*

Feng, H., et al. "Single-Shot MR Imaging Using Trapezoidal-Gradient-Based Lissajous Trajectories" IEEE Transactions on Medical Imaging, vol. 22, No. 8. Aug. 2003. pp. 925-932.

Kotsopoulos, A., et al. "Nanopositioning Using the Spiral of Archimedes: The Probe-Based Storage Case" Mechatronics, vol. 20, No. 2. Dec. 2009. pp. 273-280.

Mahmood, I., et al. "Fast Spiral-Scan Atomic Force Microscopy" Nanotechnology, vol. 20. Aug. 2009. pp. 1-4.

Melo, T., et al. "Facility Location and Supply Chain Management—A Review" European Journal of Operational Research, vol. 196, No. 2. Jul. 2009. pp. 401-412.

Okabe, A. "Spatial Tessellations: Concepts and Applications of Voronoi Diagrams" John Wiley & Sons Inc, 2000. pp. 535-536, 543-548.

Yong, Y., et al. "High-Speed Cycloid-Scan Atomic Force Microscopy," Nanotechnology, vol. 21, Aug. 2010. pp. 1-4.

* cited by examiner

EVALUATING AND OPTIMIZING A TRAJECTORY FUNCTION

TECHNICAL FIELD

The present invention relates to a method and a system for evaluating and optimizing a trajectory function.

RELATED ART

It is one main task in applications related to operational research, robotics, scanning, imaging and the like to define a trajectory along which it is scanned in an optimized manner. For instance, in applications where, e.g., a vehicle, a positioner, a light or a particle beam or the like shall be moved over a plane for sampling predefined points, this shall be performed in short time with a given spatial resolution, reduced energy consumption or other optimization objectives. In particular, if the trajectory is to be followed by a physical device, such as a probe tip or the like, constraints are involved caused by the dynamics of the physical device that follow the trajectory. In other words, even if an optimized trajectory has been determined, the physical device might not be able to follow the determined trajectory exactly, e.g., due to its mass inertia or due to other physical constraints implied by the system.

Some approaches for designing trajectories are known in the art. From document M. T. Melo et al., "Facility Location and Supply Chain Management", European Journal of Operational Research, Vol. 196, No. 2, pages 410-412, 2009, trajectory optimization is known in the context of a facility location problem in which the locations of point-like facilities are optimized either on a discrete network or in a continuous plane. The trajectory optimization problem can be cast as optimizing the locations of a facility that is moving in time.

In document Okabe, A., "Spatial Tessellations: Concepts and Applications of Voronoi Diagrams", John Wiley & Sons, Inc., 2000, solutions to the above problem have been proposed for the case of a continuous plane which are based on optimization of the Voronoi diagram that is generated by the subsequent locations of the moving facility.

It has been recognized that considering the dynamical properties of the device following the trajectory are of key importance and therefore the trajectories are designed with respect to the shape of the resulting motion and its frequency spectrum. As is, e.g., known from documents Mahmoud, I., et al., "Fast Spiral-Scan Atomic Force Microscopy", Nanotechnology, Vol. 20, Loc. 365503, 2009, Kotsopoulos, A., et al., "Nanopositioning Using the Spiral of Archimedes: The Probe-based Storage Case", Mechatronics, Vol. 20, No. 2, pages 273-280, 2010, and Yong, Y., et al., "High-speed Cycloid Scan Atomic Force Microscopy", Nanotechnology, Vol. 21, 365503, 2010, in the field of scanning probe microscopy, trajectories are generated by harmonic wave forms. Therein, a narrow-band frequency spectrum is used, which allows the design of specific hardware and control systems. For example, to follow a spiral trajectory, it is sufficient to actuate the position device merely with a single constant frequency sinusoidal wave form of growing amplitude.

As known from Feng, H., et al., "Single-shot MR imaging using trapezoidal gradient-based Lissajous trajectories", Medical Imaging, IEEE Transactions on Medical Imaging, Vol. 22, No. 8, pages 925-932, 2003, in the field of magnetic resonance imaging, the so-called Lissajous trajectories are used, which merely require a pair of single constant-frequency-constant-amplitude harmonic wave forms to traverse the area of interest.

In the design of the above solutions the trajectory does not consider the dynamics of the physical device which shall follow the trajectory. For instance, if the trajectory of a moving facility is optimized for maximum accessibility, the resulting motion might be difficult to be followed by the physical device since it might contain sharp turnarounds. On the other hand, in the frequency-based trajectory design there is no specified way for optimizing of the trajectory shape.

SUMMARY OF THE PRESENT INVENTION

According to an embodiment of a first aspect of the invention there is provided a method for evaluating a trajectory function to be followed by a physical system. According to embodiments of further aspects of the invention there is provided a method for optimizing a trajectory function, a system and a computer program product.

Further embodiments are indicated in the depending subclaims.

According to an embodiment of the first aspect, a method for evaluating a trajectory function to be followed by a physical system is provided, comprising the steps of:
   providing the trajectory function;
   determining a set of sampling points by sampling a trajectory based on the trajectory function in the time domain;
   associating a cell to each of the sampling points;
   assessing at least one cell metric for each of the cells;
   aggregating the at least one cell metric of the cells to obtain an aggregated metric measure;
   evaluating the trajectory as determined by the provided trajectory function depending on the one or more aggregated metric measures.

One idea of the above method is to provide a way to evaluate a trajectory which is obtained through a given trajectory function followed by a physical system model. The physical system model defines the dynamics and constraints of the physical system which shall follow the trajectory by means of, e.g., a physical device, such as a positioner or the like. The resulting trajectory defines sampling points at which a physical action is performed by the physical system. The resulting trajectory is then assessed by at least one metric measure characterizing the so-obtained sampling points on the resulting trajectory. The at least one metric measure is obtained by associating cells to the sampling points and determining at least one geometrical property of the cells as the cell metric. The aggregate metric measure is obtained by aggregating the determined at least one geometrical property of the cells.

The one or more metric measures are then fed to an optimization routine adapting the given trajectory function. This scheme is repeated until the metric measures fulfill a predetermined optimization objective.

The trajectories may be optimized by means of objective functions and constraints which define the requirements on spatial resolutions, speed and frequency content.

Furthermore, the trajectory function may include a trajectory operator and a set of one or more trajectory parameters, wherein the trajectory operator is selected to form one of: a Lissajous waveform, a Cartesian waveform, a radial waveform, a spiral waveform, a cycloid waveform, and a waveform generated by a combination of trigonometric functions. In general, any trajectory operator can be selected that can be analytically, algorithmically or implicitly expressed and evaluated, and wherein the trajectory parameters are related to one or more of: frequency, phase, amplitude, radius and general analytical functions.

Furthermore, it may be provided that the steps of determining the set of sampling points comprises determining the trajectory based on a provided model of the physical system.

Particularly, the model of the physical system may include a dynamic response of the physical system when the trajectory function is applied thereon, wherein the dynamic response includes at least one of mechanical resonant modes, gain, phase response, coupling characteristics, non-linearities, the properties of the control and sensing schemes.

According to an embodiment, the sampling of the trajectory in the time domain may be performed by sampling equally distanced sampling points on the trajectory or by sampling at equal sampling intervals.

Moreover, to each of the sampling points a Voronoi cell may be associated. The assessment of the obtained trajectory of the physical device may hence be based on Voronoi tessellations, which are used to calculate the metric measures by computing the cell metrics, i.e., the geometric characteristics of the Voronoi cells and aggregate the obtained values to the metric measures which characterize the distribution of the Voronoi cells. This provides a solid foundation for a fair and universal comparison of the trajectories.

It may be provided that the at least one cell metric includes one or more of the following characteristics: an area of the cell, a radius of the cell, a centroid of the cell, a skew of the cell, a height of the cell and a width of the cell.

The step of aggregating the at least one cell metric of the cells to obtain an aggregated metric measure may include determining the minimum, the maximum, the average or the variance of the at least one cell metric.

According to an embodiment of a further aspect, a method for optimizing a trajectory function to be followed by a physical system is provided. The method comprises the steps of:
  evaluating the trajectory function to be followed by a physical system according to the method of one of the preceding methods;
  optimizing the trajectory function by adapting a trajectory operator and/or a set of one or more trajectory parameters of the trajectory function depending on a result of a given objective function applying the at least one aggregated metric measure.

Moreover, the objective function may combine a plurality of weighted aggregate metric measures, wherein the trajectory operator and/or the set of one or more trajectory parameters are adapted to minimize or maximize the result of the objective function applying the at least one aggregated metric measure.

According to an embodiment of a further aspect, a system for evaluating a trajectory function to be followed by a physical system is provided, where in the system is configured to:
  provide the trajectory function;
  determine a set of sampling points by sampling a trajectory based on the trajectory function in the time domain;
  to associate a cell to each of the sampling points;
  to assess at least one cell metric for each of the cells;
  to aggregate the at least one cell metric of the cells to obtain an aggregated metric measure;
  to evaluate the trajectory as determined by the provided trajectory function depending on the one or more aggregated metric measures.

It may be provided that the system is configured to determine the trajectory based on a provided model of the physical system.

According to an embodiment of a further aspect, a system for optimizing a trajectory function to be followed by a physical system is provided, wherein the system is configured to:
  evaluate the trajectory function to be followed by a physical system according to the above method;
  optimize the trajectory function by adapting a trajectory operator and/or a set of one or more trajectory parameters of the trajectory function depending on a result of a given objective function applying the at least one aggregated metric measure.

According to an embodiment of a further aspect, a computer program product including program code is provided which when executed on a data processing unit carries out the above methods.

BRIEF DESCRIPTION OF THE DRAWINGS

Preferred embodiments of the present invention are described in more detail in conjunction with the accompanying drawings, in which.

DETAILED DESCRIPTION OF EMBODIMENTS

In the following, the method for evaluating and designing a trajectory for a physical system is described, such as a positioning, scanning or imaging system, as, e.g., used in scanning probe microscopy or magnetic resonance imaging for industrial and medical applications. The method is exemplarily described for a positioner that allows positioning a probe head arbitrarily on a two-dimensional plane by means of an X actuator and a Y actuator. The present invention is, however, not restricted to position/move a probe head along a trajectory but also comprise directing/moving electromagnetic or particle beams across an object or plane to be scanned. Furthermore, the present invention is, however, not restricted to two-dimensional positioning, but can also be applied to higher-dimensional trajectories in general.

Figure 1:
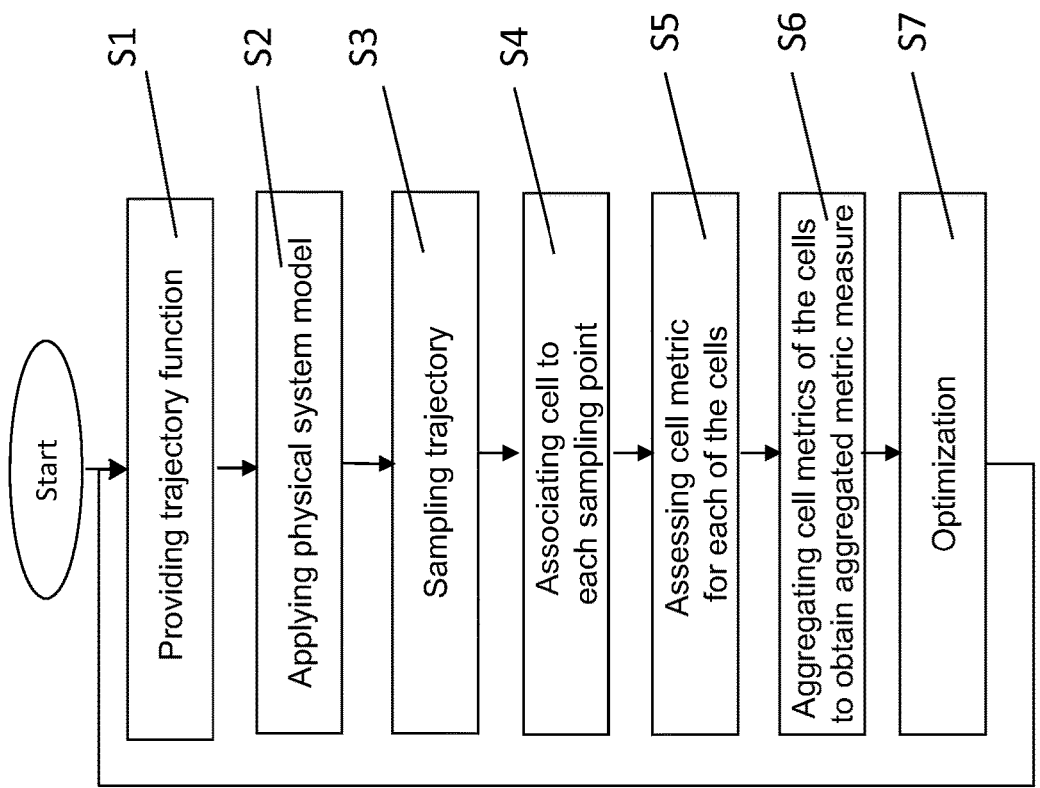
FIG. 1 shows a flow chart for illustrating the method steps for designing a trajectory for a physical system.

The method for evaluating a trajectory and designing an optimized trajectory therefrom is described in conjunction with the flow chart of FIG. 1.

Depending on the application for which the trajectory shall be designed and optimized, a trajectory function can be given in step S1 which is defined by a given trajectory operator and a set of one or more given trajectory parameters. Initially, the given trajectory operator and the given one or more trajectory parameters are preset.

As shown in reference Knopp et. al., "Trajectory analysis for magnetic particle imaging", Physics in Medicine and Biology, 2009 (illustration of FIG. 2), a broad variety of different trajectory functions (operators) is available for preselection. For instance, trajectory functions of a Lissajous or Cartesian type may be preferred for a full-area coverage of a rectangular area to be scanned, while radial or spiral trajectory functions might be better suited for objectives with an area focus on the plane to be scanned.

Figure 2:
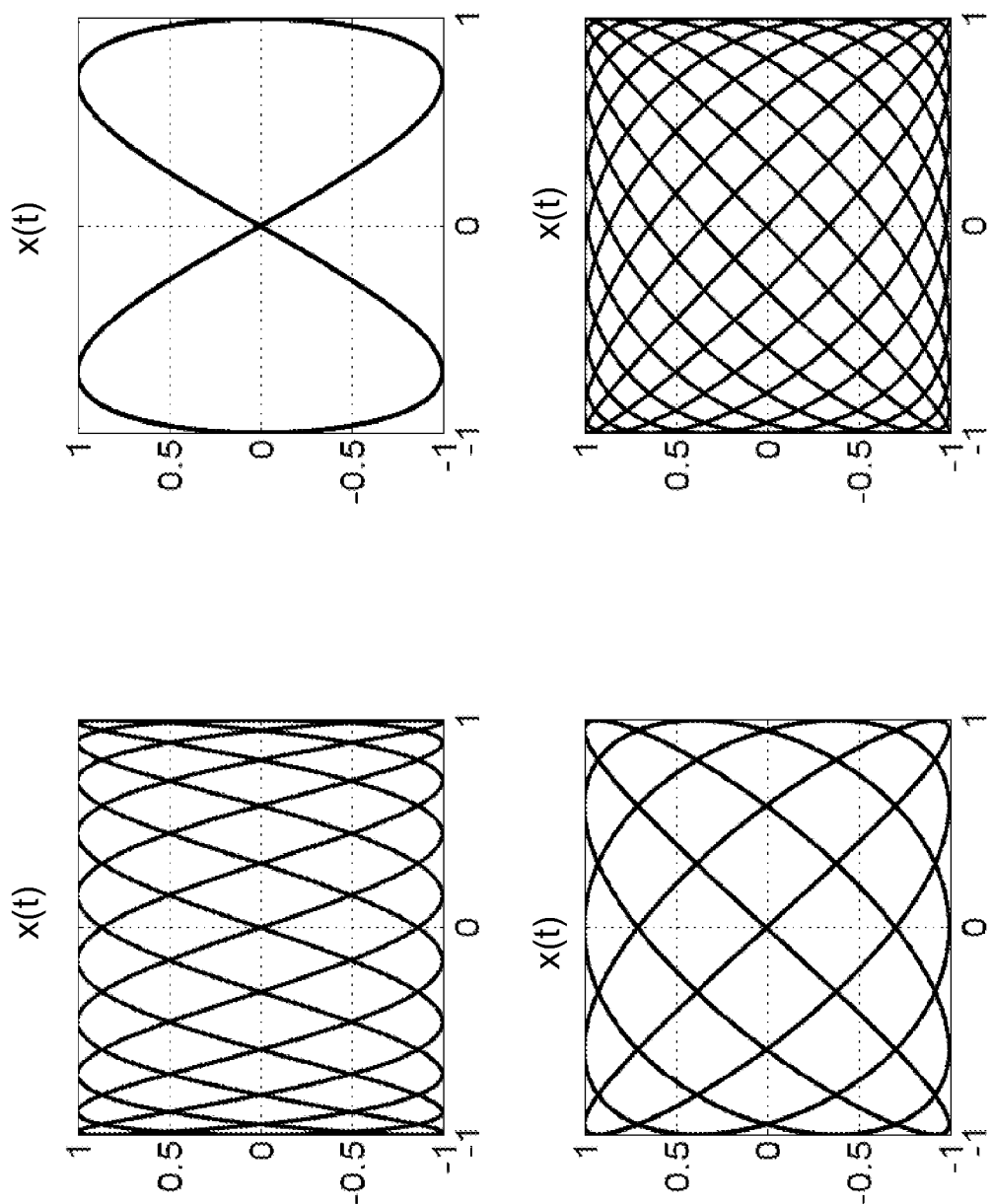
FIG. 2 shows charts illustrating the shapes of different Lissajous trajectory functions.

In general, a trajectory is generated by operator $Tr(\bullet); \mathbb{R}^P \to \mathbb{C}^m[0, T]$, where T is the duration of the trajectory. The trajectory parameter $$\alpha = [\alpha_1 \alpha_2 \ldots \alpha_p]^T \in \mathbb{R}^P$$

is constant in time and uniquely determines the trajectory coordinates at time t $$x(t) = [x_1(t) x_2(t) \ldots x_m(t)]^T = Tr(\alpha)$$

for $t \in [0, T]$. For instance, in case of a spiral trajectory the set of trajectory parameters $\alpha$ may specify the spiral diameter and interspire pitch. In case of Lissajous trajectory functions the set of parameters may specify the Amplitude and the frequency of trigonometric functions. In FIG. 2 examples for Lissajous trajectory functions having different sets of parameters are illustrated.

In view of the example of a positioner with a probe head, it is assumed that the given trajectory function x(t) drives the probe head so that it follows the trajectory. The behavior of the physical system, i.e., the probe head, is described by a physical system model which is denoted by P, so that the resulting position at time t will be denoted as y(t)=P(x(t)) which is determined in step S2. It is noted that P can model complex dynamics including passive damping, active closed loop compensation, sensor characteristics and crosstalk.

According to step S3, the trajectory is effectively sampled at discrete time instances $T_s(i)$, $i=1, \ldots, N$, $T_s(1)=0$, $T_s(N)=T$ when the probe head of the positioner is at position $y(T_s(i))$, for instance, if regular sampling is used with the sampling period $\tilde{T}$, $T_s(i)=(i-1)\tilde{T}$.

The objective of a trajectory design may be to determine a trajectory function defined by trajectory operator $Tr(\bullet)$ such that the set of sampling points $S(i):=y(T_s(i))$ cover the area of interest
  with a desirable frequency spectrum of x(t)
  in a given time T and
  with given spatial resolution.

From step S3, a set of sampling points S(i) is obtained, the characteristics (or distribution) of which now have to be assessed with respect to how good they fulfill one or more requirements determined by the application if the positioner is moved according to the given trajectory on which the sampling points S(i) are located. To evaluate the quality of the distribution of the set of sampling points S(i) with respect to a given or an objective for arrangement and/or distribution, use is made of a Voronoi tessellation.

Figure 3:
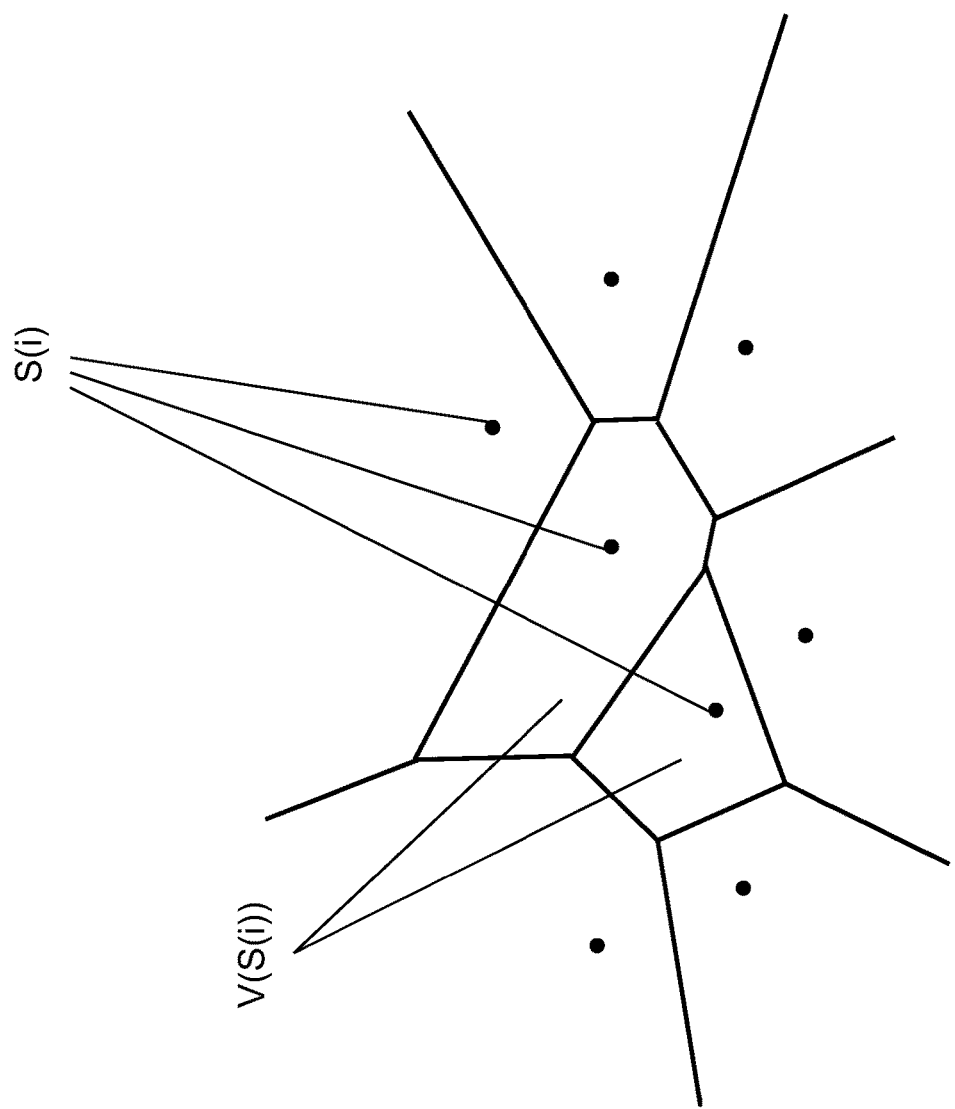
FIG. 3 shows an example of a Voronoi diagram based on a given set of sampling points.

With respect to FIG. 3, a Voronoi tessellation for a given set of sampling points S(i) is illustrated. A Voronoi tessellation V is chosen to obtain a universal metric measure for the spatial distribution of the sampling points S(i). In step S4, the sampling points $\{S(i)\}_{i=1}^N$ are used as a generator set for the Voronoi tessellation of the area to be scanned. In the Voronoi tessellation V, the area to be scanned is partitioned into a set of Voronoi polygons V(S(i)), or cells, $$V = \{V(S(1)), \ldots, V(S(N))\}$$

with each cell associated to exactly one sampling point from $\{S(i)\}_{i=1}^N$. Cell V(S(i)) is the subregion of the scan area in which all the points are closer to S(i) than to any other sampling point S(i) on the resulting trajectory:

$$V(S(i)) = \{x | \|x - S(i)\| \le \|x - S(j)\|, j \ne i, j = 1, \ldots, N\} \text{ for } i = 1, \ldots, N.$$

In other words, given a set of two or more distinct sampling points S(i) in a Euclidean plane, all the locations in that space are associated to that sampling point S(i) that is closest with respect to the Euclidean distance. This leads to a tessellation of the plane into a set of the regions associated with the members of the set of sampling points.

Figure 4:
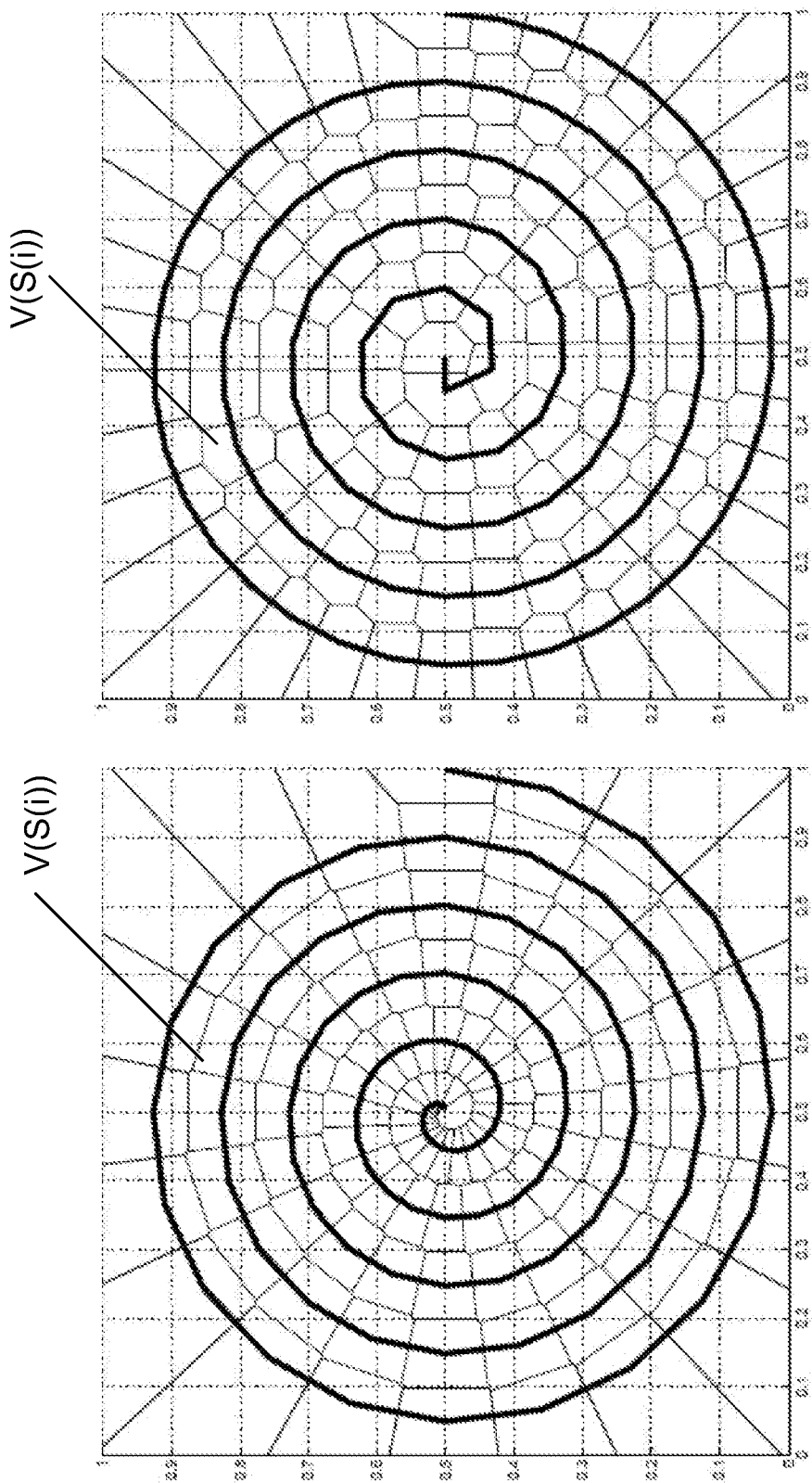
FIG. 4 shows diagrams illustrating the Voronoi diagrams depending on the kind of sampling in the time domain.

FIG. 4 shows two Voronoi diagrams generated by two different scan trajectories that were sampled (steps 83) with a fixed regular sampling time. In the diagram on the left side of FIG. 4, the trajectory is a spiral with constant angular velocity. It can be noticed that the size of the Voronoi cells is not uniform over the area to be scanned. The cells in the center of the area are smaller because the linear velocity 20 is lower and the data is sampled more often. In the diagram on the right side of FIG. 4, the trajectory is a spiral with constant linear velocity, constituting a Voronoi diagram in which the cells V(S(i)) are significantly more regular in size.

By using the Voronoi tessellation, the spatial resolution of a trajectory can be quantified in a rigorous manner and treated as a non-linear operator.

Figure 5:
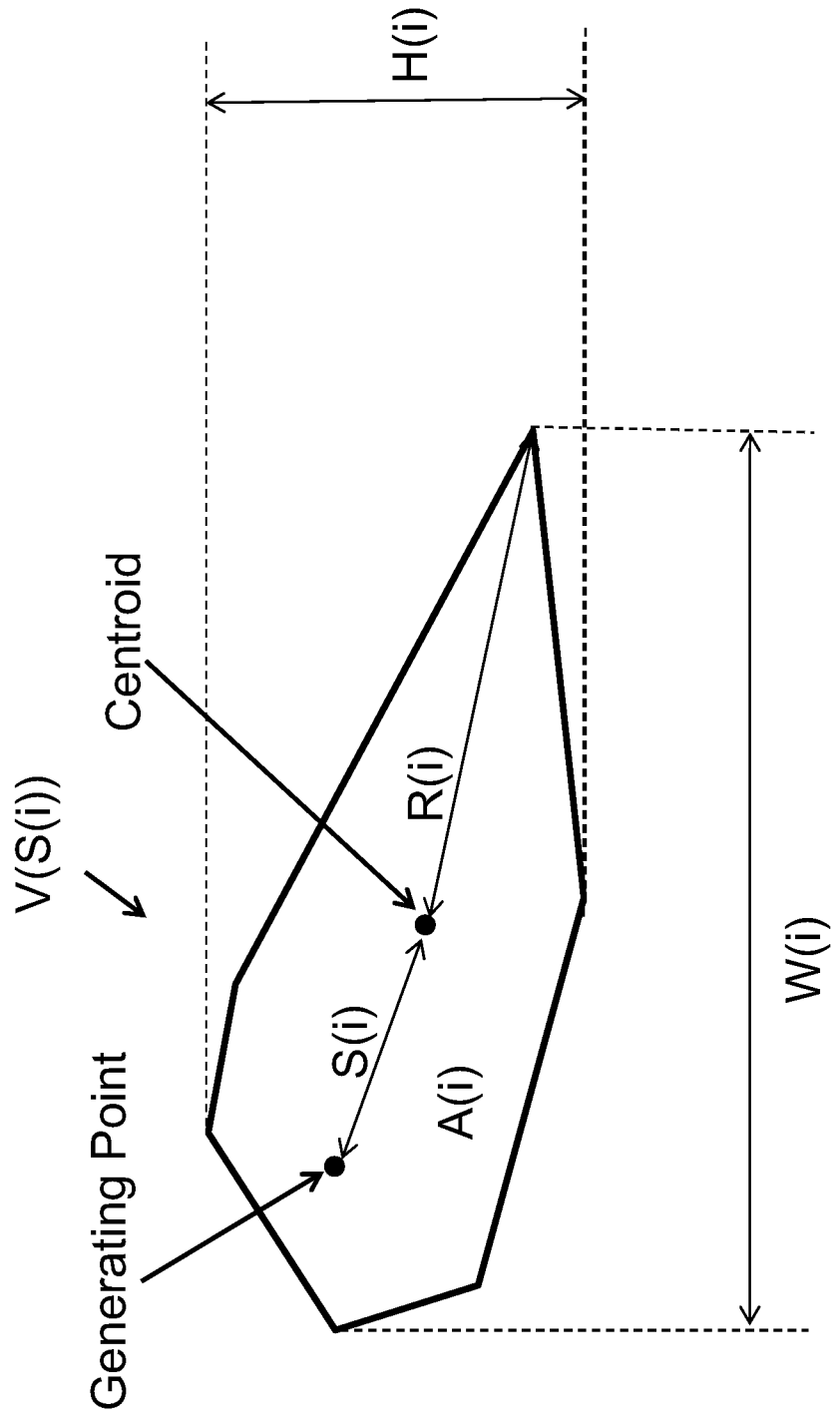
FIG. 5 shows an illustration of a Voronoi cell with indication of the metric measures to be calculated.

As a next step S5, the cell metrics are computed for each cell S(i). The cell metrics characterize the geometrical properties of each cell. A sample of a two-dimensional Voronoi cell V(S(i)) is shown in FIG. 5. In general Voronoi cells are created as follows:

The Voronoi cells V(S(i)) are convex polygons, wherein the vertices $\upsilon$ are denoted as $$\upsilon_1, \ldots \upsilon_n, \upsilon_i = [\upsilon_i^x \ \upsilon_i^y]$$

and for simplicity $\upsilon_j := \upsilon_{j \bmod n}$ for $j > n$.

As examples, the following geometrical cell metrics for the Voronoi cell S(i) can be determined as follows:

The area A(i) of the cell V(S(i)) is computed as $$A(i) = \frac{1}{2} \sum_{j=0}^{N} v_j^x v_{j+1}^y - v_{j+1}^x v_j^y.$$

Knowing the area, the centroid (center of mass) of a cell, C(i), can be computed as $$C(i) = \frac{1}{6A(i)} \begin{bmatrix} \sum_{j=0}^{N} (v_j^x + v_{j+1}^x)(v_j^x v_{j+1}^y - v_{j+1}^x v_j^y) \\ \sum_{j=0}^{N} (v_j^y + v_{j+1}^y)(v_j^x v_{j+1}^y - v_{j+1}^x v_j^y) \end{bmatrix}$$

Once the centroid C(i) is known, we can define the radius R(i)

$$R(i) = \max_j \|v_j - C(i)\|.$$

Notice that the generating point does not necessarily coincide with the centroid C(i); to quantify the dislocation, we can define the skew Q(i) of the cell, $$Q(i) = \|S(i) - C(i)\|.$$

Useful metrics are also the width W(i) and height H(i) of the cell, $$W(i) = \max_{j,k} \|v_j^x - v_k^x\|$$

$$H(i) = \max_{j,k} \|v_j^y - v_k^y\|.$$

The suggested cell metrics capture the basic geometric properties of a Voronoi cell. Clearly, other cell metrics may be devised which are found useful in a particular problem.

In step S6, the determined cell metrics characterizing the geometric properties of a specific Voronoi cell are aggregated to obtain one or more aggregate metric measures M which characterize the distribution of the sampling points S(i) over the Voronoi diagram which covers the area to be scanned and for which the trajectory shall be designed. Standard norms and statistical moments, such as maximum, mean, variance or others, can be used to aggregate the cell metrics determined for the Voronoi cells in step S5.

The so-called aggregate metric measures M are suitable for characterizing the shape of the cells in the Voronoi diagram and, in particular, the spatial resolution of the trajectory or the distribution of the sampling points S(i).

For example, the maximum radius $\max_i R(i)$ of all Voronoi cells V(S(i)) is typically highly representative of the spatial resolution. This is because it is closely related to the size of the largest empty rectangle that can be inscribed into the area to be scanned without intersecting one of the sampling points S(i). Other aggregate metric measures M are useful in characterizing the shape, orientation and uniformity of the cells, such as maximum cell skew $\max_i Q(i)$, mean cell radius $\overline{R}$, variance of the cell radius or maximum cell width.

The aggregate metric measures M obtained in step S6 may serve as values which allow an assessment of the quality of the distribution of the sampling points, the route of the trajectory and the other characteristics.

Once the aggregate metric measures M are obtained in step S6, an optimization routine may be performed in step S7, based on an objective function $F(\alpha)$, wherein $\alpha \in R^n$ is minimized under the constraints specified by inequalities (without loss of generality) $g_k(\alpha) \leq 0$ for $k=1, \ldots, c$. The constraints constitute a region of feasible solutions in $R^n$ $$F = \{\alpha | g_k(\alpha) \leq 0\}.$$

Out of all feasible solutions, the one is searched which minimizes the value of the objective function $F(\alpha)$, i.e.

$$\alpha^* = \mathrm{argmin}_{\alpha \in F} F(\alpha).$$

In the problem of trajectory design with trigonometric operators, the objective function and the constraints are the three design criteria of the trajectory, namely duration, frequency content and spatial resolution. It is imperative that the objective function and constraints can be expressed in terms of the trajectory parameter $\alpha$; while this is typically straightforward for the duration and frequency content, a more involved technique might be required for the spatial resolution.

The objective function and constraints pertaining to the spatial resolution are based on the trajectory function or trajectory operator defined as a function of one or more aggregate metric measures M. For example, to optimize the maximum cell radius and penalize high skew of the cells, the objective function may be defined as $$F(\alpha) = \gamma_1 \max_i R(i) + \gamma_2 \sum_i S(i) + \gamma_3 \mathrm{var} S(i)$$

where $\gamma_1$, $\gamma_2$ and $\gamma_3$ are normalization factors. The optimization becomes $$\alpha^* = \min_\alpha \gamma_1 \max_i R(i) + \gamma_2 \sum_i (i) S(i) + \gamma_3 \mathrm{var} S(i).$$

While minimizing the maximum cell radius $\max_i R(i)$ corresponds to improving the spatial resolution of the trajectory, minimizing the mean and variance of the cells V(S(i)) ensures that the cells of the Voronoi diagram are centered around the respective (associated) sampling point S(i), which might be an indication with respect to the uniformity of the distribution of the sampling points.

The optimization problem presented is typically non-linear and non-convex, so that it is often difficult or impossible to solve the optimization problem analytically. Instead, numerical methods can be used which yield an approximate solution that is close to a local minimum or maximum, such as the descent method or penalty function method. For very simple problems, it is sometimes also possible to use exhaustive search or other algorithms, such as the Fortune Sweep Algorithm that can compute the aggregate metric measures M of the tessellation in O(NlogN) time.

In the following, the method is described as an example with a trajectory function that is made of purely harmonic wave forms.

It is considered that a two dimensional area of a fixed size is to be covered by the trajectory $$Tr(\alpha) = Tr([A_x f_x A_y f_y]) = \begin{bmatrix} \sum_j^{N_x} A_x^j \sin(2\pi f_x^j t) \\ \sum_j^{N_y} A_y^j \sin(2\pi f_y^j t) \end{bmatrix}$$

where $A_x$, $f_x$, $A_y$ and $f_y$ are amplitudes and frequencies, respectively, in two perpendicular axes, x and y. If $N_x = N_y = 1$, each axis (X actuator and y actuator) is driven by exactly one sinusoid. The resulting x(t) traces a specific shape which is called a Lissajous/Bowditch curve. Scan trajectories with $N_x$ or $N_y$ greater than one are also highly interesting and are referred to as multifrequency Lissajous curves.

In the following, a method for optimizing the Lissajous trajectory function is presented. An embodiment is given for $N_x = 1$, $N_y = 1$ and a set of objective functions that relate to spatial resolution. The same method can be used to optimize the frequency spectra of the trajectory, its duration, velocity or other properties.

First, the set of constraints must be determined. In this embodiment, we ensure that the trajectory is efficient and that the duration is fixed.

In order for the trajectory to be efficient, the frequencies $f_x$ and $f_y$ must be constrained. Namely, it is required that the trajectory is closed, i.e. that it ends at the start point. This implies that $f_x/f_y$ must be a rational number; otherwise, the Lissajous curve would never return to its starting point and would completely scan the area to be scanned in infinite time. Assuming that $f_x/f_y$ is a rational number, it can be shown that the duration of the trajectory, T, must be equal to the least common multiple (lcm) of the periods corresponding to $f_x$ and $f_y$, i.e.

$$T = \mathrm{lcm}(1/f_1, 1/f_2).$$

Furthermore, it is required that the area to be scanned is traversed efficiently, without retracing parts that have already been scanned. To achieve this, the Lissajous trajectory should be prevented from hitting one of the corners of the scan area. Intuitively, this is because there is no "smooth" way out of the corner; the only possibility is that the Lissajous curve retracts on the same trajectory. By a simple computation, it can be shown that this happens if and only if there are some k, l ∈ N such that $$f_x/f_y = (2k+1)/(2l+1).$$

In addition to the constraints on the efficiency of the trajectory, a fixed duration of T=1 is required. This yields the following set of constraints:

$$T = lcm(1/f_1, 1/f_2) = 1 \quad \text{(C1)}$$

$$\forall k, l \in \mathbb{N}: \frac{f_x}{f_y} \neq (2k+1)/(2l+1). \quad \text{(C2)}$$

Notice that constraint C1 implies that $$\frac{f_x}{f_y} \in \mathbb{Q}.$$

Next, the objective function is chosen. In this embodiment, objective functions are used that capture the requirement on the spatial resolution. Possible objective functions are considered:
1. Maximum cell area $$MA = \max_i A(i)$$

2. Maximum cell radius $$MR = \max_i R(i)$$

3. Variance of the cell radius $$VR = \text{var } R(i)$$

4. Maximum cell skew $$MS = \max_i S(i)$$

The objective functions refer to the aggregate metric measures M for spatial resolution as explained above. In the optimization process, a solution is searched for that satisfies the given constraints and minimizes the value of the objective function. The minimization is done over the space of trajectory parameters $$\alpha = A_x, f_x, A_y, f_y$$

with $A_x=1$ and $A_y=1$ fixed. The sampling is regular with $T_s=1$ $e^{-3}$ and the positioner is assumed to be ideal in the given frequency region, P=1.

The trajectory function defined by $f_x=2$, $f_y=1$, resulting from the first objective function minimizes the maximum cell area. The solution is degenerate because the cell area is not representative of the geometrical shape of the cell. The optimal solution is very low frequencies that result in a low linear velocity of the trajectory and consequently, generates many cells of a very small area.

The trajectory function defined by $f_x=18$, $f_y=17$, resulting from the second objective function was obtained by minimizing the maximum radius of the cells. In contrast to the area minimization of the first objective function, the geometry of the cells is significantly improved. The disadvantage of the obtained trajectory, however, is the variation in the cell radii. In particular, the radii of the cells that are in the center of the scan area are significantly larger than those of the cells near the margins of the scan area.

The above disadvantage might be overcome by optimizing the radius variance according to the third objective function. The optimal solution obtained by minimizing the third objective function has frequencies $f_x=20$, $f_y=1$. This results in the cell radii of the trajectory to be very regular.

However, the actual spatial resolution is lower than expected. The reason is the high skew of the cells. For instance, at the center and margins of the scan area, the sampling points associated to the cells do not coincide with their centroids. This can be dramatically improved by taking the cell skew into account according to the fourth objective function. The trajectory which minimizes the maximum cell skew has frequencies of $f_x=25$, $f_y=8$.

The invention claimed is:
1. A method for evaluating a trajectory function to be followed by a physical device of a physical system, comprising the steps of:
   providing the trajectory function;
   determining a set of sampling points at which a physical action is performed by the physical device of the physical system by sampling a trajectory based on the trajectory function in the time domain;
   associating a cell to each of the sampling points of the physical device;
   assessing at least one cell metric for each of the cells, where the cell metric is an area of the cell, a radius of the cell, a centroid of the cell, a skew of the cell, a height of the cell, or a width of the cell;
   aggregating the at least one cell metric of the cells to obtain an aggregated metric measure;
   evaluating the trajectory as determined by the provided trajectory function depending on the aggregated metric measure to optimize the trajectory to be followed by the physical device of the physical system optimizing the trajectory function by adapting a trajectory operator and/or a set of one or more trajectory parameters of the trajectory function depending on a result of an objective function applying the aggregated metric measure; and
   driving the physical device of the physical system to follow the trajectory.
2. The method according to claim 1, wherein the trajectory operator is selected to form one of: a Lissajous waveform, a Cartesian waveform, a radial waveform, a spiral waveform, a cycloid waveform, a waveform generated by a combination of trigonometric functions.
3. The method according to claim 1, wherein the steps of determining the set of sampling points comprises determining the trajectory based on a provided model of the physical system.
4. The method according to claim 3, wherein the model of the physical system includes a dynamic response of the physical system when the trajectory function is applied thereon, wherein the dynamic response includes at least one of mechanical resonant modes, gain, phase response, coupling characteristics, nonlinearities, or properties of control and sensing schemes.
5. The method according to claim 1, wherein sampling of the trajectory in the time domain is performed by sampling equal distanced sampling points on the trajectory or by sampling at equal sampling intervals.
6. The method according to claim 1, wherein a Voronoi cell is associated to each of the sampling points.

7. The method according to claim 1, wherein aggregating the at least one cell metric of the cells to obtain an aggregated metric measure includes determining a minimum, a maximum, an average, or a variance of the at least one cell metric.

8. The method according to claim 1, wherein the objective function combines a plurality of weighted aggregate metric measures, wherein the trajectory operator and/or the set of one or more trajectory parameters are adapted to minimize or maximize the result of the objective function applying the at least one aggregated metric measure.

9. A non-transitory computer program product including program code which, when executed on a data processing unit carries out the method according to claim 1.

10. A system comprising a data processing unit for evaluating a trajectory function to be followed by a probe head of a physical system, wherein the data processing unit is configured to:
provide the trajectory function;
determine a set of sampling points at which a physical action is performed by the probe head of the physical system by sampling a trajectory based on the trajectory function in the time domain;
to associate a cell to each of the sampling points of the probe head;
to assess at least one cell metric for each of the cells, where the cell metric is an area of the cell, a radius of the cell, a centroid of the cell, a skew of the cell, a height of the cell, or a width of the cell;
to aggregate the at least one cell metric for each of the cells to obtain an aggregated metric measure;
to evaluate the trajectory as determined by the provided trajectory function depending on the aggregated metric measure to optimize the trajectory to be followed by the probe head of the physical system optimize the trajectory function by adapting a trajectory operator and/or a set of one or more trajectory parameters of the trajectory function depending on a result of a given objective function applying the at least one aggregated metric measure; and
drive the probe head of the physical system to follow the trajectory.

11. The system according to claim 10, wherein the data processing unit is configured to determine the trajectory based on a provided model of the physical system.

* * * * *